United States Patent [19]
Chu et al.

[11] Patent Number: 5,851,900
[45] Date of Patent: Dec. 22, 1998

[54] METHOD OF MANUFACTURING A SHALLOW TRENCH ISOLATION FOR A SEMICONDUCTOR DEVICE

[75] Inventors: Chih-Hsun Chu, Hsinchu; Ching-Nan Yang, Hsinchu Hsien, both of Taiwan

[73] Assignee: Mosel Vitelic Inc., Hsinchu, Taiwan

[21] Appl. No.: 848,583

[22] Filed: Apr. 28, 1997

[51] Int. Cl.$^6$ ............................................. H01L 21/76
[52] U.S. Cl. ..................... 438/434; 438/224; 438/561; 438/563
[58] Field of Search .................... 438/224, 434, 438/561, 563, 227

[56] References Cited

U.S. PATENT DOCUMENTS

| | | |
|---|---|---|
| 4,666,557 | 5/1987 | Collins et al. . |
| 4,745,081 | 5/1988 | Beyer et al. . |
| 4,782,036 | 11/1988 | Becker et al. . |
| 5,478,776 | 12/1995 | Luftman et al. . |
| 5,482,883 | 1/1996 | Rajeevakumar . |
| 5,726,094 | 3/1998 | Schwalke et al. . |

OTHER PUBLICATIONS

Wolf, S., "Silicon Processing for the VLSI Era: vol. 3, The Submicron Mosfet", Lattice Press, pp. 406–412, 1995.
Nagayama et al., "A New Process for Silica Coating", J. Electrochem. Soc., 135, 1988, pp. 2013–2016.
K. Awaza, "Growth mechanisms of silica glasses using the liquid phase deposition (LPD)", J. Non–Cryst. Solids, 151, 1992, pp. 102–108.
T. Goda, et al., "Physical and Chemical Properties of Silicon Dioxide Film Deposited by New Process", Mat. Res. Soc., Symp., 105, 1988, pp. 283–288.

*Primary Examiner*—George Fourson
*Attorney, Agent, or Firm*—Merchant, Gould, Smith, Edell, Welter & Schmidt

[57] ABSTRACT

A new method for forming shallow trench isolation is disclosed herein. A pad oxide layer and a silicon nitride layer are formed on a wafer, respectively. A plurality of trenches are created in the wafer. Then, a SAC layer is formed on an N-well. A BSG layer is formed on a P-well and the N-well. A thermal process is used to form a channel stop in the P-well. Then, the BSG layer and the SAC layer are removed. Subsequently, a LPD oxide layer is deposited in the trenches. Then, a CMP process is used to polish the LPD oxide layer for planarization. The pad oxide layer and the silicon nitride layer are removed. Next, a gate oxide layer is formed on the wafer.

14 Claims, 5 Drawing Sheets

METHOD OF MANUFACTURING A SHALLOW TRENCH ISOLATION FOR A SEMICONDUCTOR DEVICE

FIELD OF THE INVENTION

The present invention relates to a method of isolation for integrated circuit (IC), and more specifically, to a method of forming a shallow trench isolation for a semiconductor device.

BACKGROUND OF THE INVENTION

To manufacture electric circuits involves connecting isolated devices through specific conducting paths. Typically, devices isolated from one another must first be formed in the silicon substrate. Then they are interconnected to form some desired circuit function. It is a complicated and challenging task to establish an effective isolation in submicron ICs in the face of decreased isolation space in ULSI or VLSI.

At present, many of isolation technologies have been proposed such as LOCOS (LOCal Oxidation of Silicon), shallow trench isolation (STI) and so on. The most widely used method for generating the isolation is the LOCOS structure. The LOCOS involves the formation of Field OXides (FOX) in the nonactive regions of the substrate. As device geometry reaches submicron size, conventional LOCOS isolation has a limitation. For example, the bird's beaks structure and shape causes unacceptably large encroachment of the field oxide into the device active regions. Further, the topography of the LOCOS is inadequate for submicron devices.

Trench isolation is used primarily for isolating devices in VLSI and ULSI, and hence they can be considered as replacement for conventional LOCOS isolation. Further, shallow trench isolation is gaining popularity for quarter-micron technology. In the basic shallow trench isolation (STI) technology, shallow trenches are anisotropically etched into the silicon substrate. Next, a CVD oxide is deposited onto the substrate and is then be planarization by CMP (Chemical Mechanical Polishing) or etching back.

Further, Liquid Phase Deposition (LPD) oxide will be used in the present invention. The LPD oxide is a technology for forming silicon dioxide in an aqueous solution at a temperature about 40° C. (room temperature is permissible). The LPD oxide can be formed by immersing a silicon substrate in supersaturated hydrofluorosilicic acid ($H_2SiF_6$) solution with silica gel. The chemical reaction for the treatment solution has been proposed by Nagayama et al. (see "A new process for silica coating", J. Electrochem. Soc., 135, 1988, pp2013). The reaction can be shown as $H_2SiF_6 + 2H_2O \leftrightarrows 6HF + SiO_2\downarrow$. The LPD oxide can be selectively deposited against a silicon nitride film. In addition, it can be conformably formed on a substrate. Some of the related references can be seen in K. Awazu, "Growth mechanisms of silica glasses using the liquid phase deposition (LPD)", J. Non-Cryst. Solids, 151, 1992, pp102. T. Goda, et al., "Physical and chemical of silicon dioxide film deposition by new process", Mat. Res. Symp., 105, 1988, pp283.

SUMMARY OF THE INVENTION

A silicon substrate an be p type or n type silicon with <100>crystallographic orientation. A P-well and an N-well are generated by photolithography and implantation processes. A silicon oxide layer is then formed on the P-well and N-well to act as a pad layer. Subsequently, a silicon nitride layer is deposited on the pad layer to serve as a stop layer for subsequent chemical mechanical polishing (CMP). Next, a plurality of shallow trenches are formed by patterning and etching.

An oxide layer is formed by thermal oxidation on the surfaces of the trenches and on the side wall of the silicon oxide. The silicon oxide layer is utilized for serving as a sacrificial oxide (SAC) layer. A photoresist is patterned on the on the N-well to expose the P-well. Then, the SAC layer that is formed on the P-well is removed by using etching. A BSG layer is formed along the surface of the trenches. Then, a thermal process is performed for driving boron ions to diffuse from the BSG layer into the P-well. Thus, a channel stop layer is formed in the P-well by the thermal process. The BSG layer is removed. Next, the SAC layer is also removed. An oxide layer is formed on the surfaces of the trenches and on the silicon nitride layer. The oxide layer 22 that is formed on the silicon nitride layer 10 is dipped off.

A LPD oxide layer is selectively deposited and refilled into the shallow trenches. Then, a CMP process is performed to remove a portion of the LPD oxide layer for planarization. Residual LPD oxide is remained in the trenches. Thus, the shallow trench isolations are formed. Subsequently, the silicon nitride layer and the silicon oxide layer are removed, respectively. A silicon oxide layer is formed on the substrate adjacent to the shallow trench isolations. The silicon oxide is used to act a gate oxide layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclose to create shallow trench isolations (STI) in a substrate by using LPD (Liquid Phase Deposition) oxide. Further, a BSG layer is also used for forming a channel stop in a P-well. As will be seen below, these techniques can be used for improving the planarization of the shallow trench isolations.

Figure 1:
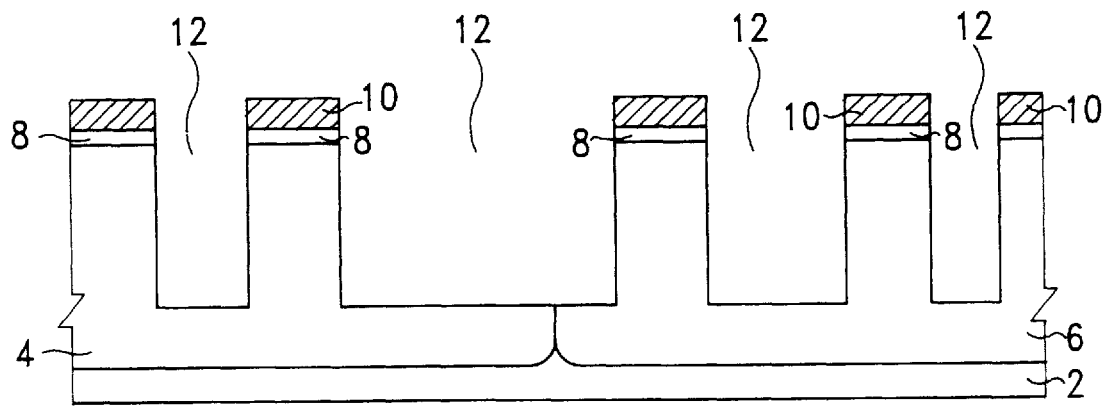
FIG. 1 is a cross section view of a semiconductor wafer illustrating the steps of forming a P-well and a N-well in a substrate, forming a plurality of shallow trenches in the substrate in accordance with prior art.

Referring to FIG. 1, in the preferred embodiment a silicon substrate 2 can be p type or n type silicon with <100>crystallographic orientation. A P-well 4 and an N-well 6 are generated in a conventional manner. In other words, photo-lithography and ion implantation processes are used to form these two well. In an embodiment, a photoresist is patterned on the N-well 6. Then, an ion implantation is used to form the P-well. The photoresist is stripped. Next, another photoresist is used to expose the P-well 6. Subsequently, the N-well is formed by ion implantation. A silicon oxide layer 8 is then formed on the P-well 4 and N-well 6 to act as a pad layer. The silicon oxide 8 is typically formed by using a thermal oxidation in an oxygen ambient. In one embodiment, the silicon dioxide layer 8 is formed by using an oxygen-steam ambient, at a temperature of about 800°–1100° C. Alternatively, the oxide layer 4 may be formed using any suitable oxide chemical compositions and procedures. Subsequently, a silicon nitride layer 10 is deposited on the pad layer 8 to serve as a stop layer for subsequent chemical mechanical polishing (CMP). The silicon nitride layer 10 can be deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). The thickness of the silicon nitride layer is about 1000 to 2000 angstroms. In the preferred embodiment, the reaction gases of the step to form silicon nitride layer 10 are SiH4, NH3, N2, N2O or SiH2Cl2, NH3, N2, N2O.

Next, a photoresist is patterned on the silicon nitride layer 10 to define shallow trench isolation regions. Then, an etching is used to etch the silicon nitride layer 10, the silicon oxide layer 8 and the substrate 2 by using the photoresist as an etching mask. A plurality of shallow trenches 12 are formed by this step. Typically, the depth of the shallow trenches 12 are about 2000 to 8000 angstroms from the surface of the silicon nitride layer 10. The photoresist is removed away after the trenches 12 are formed. Then, wet clean process is used to clean the substrate 2.

Figure 2:
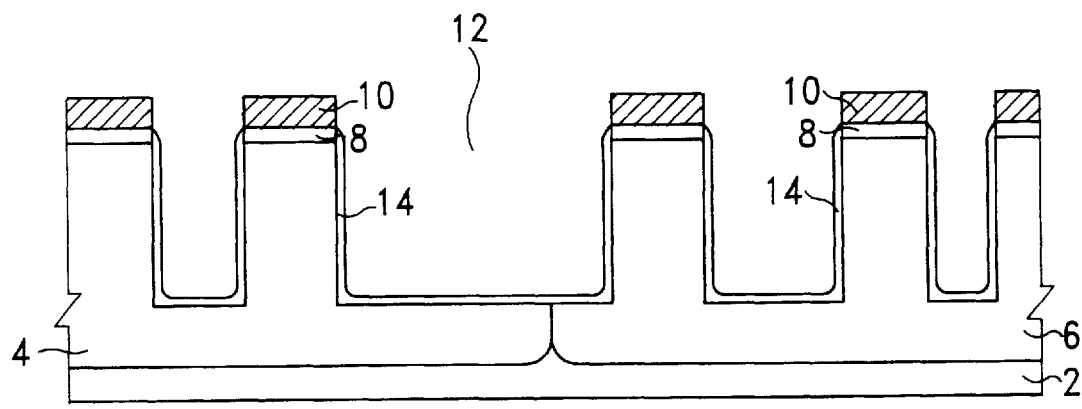
FIG. 2 is a cross section view of a semiconductor wafer illustrating the step of forming a SAC layer on the substrate in accordance with the present invention.

Turning to FIG. 2, an oxide layer 14 is formed by thermal oxidation on the surfaces of the trenches 12 and on the side wall of the silicon oxide 8. The silicon oxide layer 14 is utilized for serving as a sacrificial oxide (SAC) layer. In addition, the thickness of the oxide layer 14 is about 100 to 200 angstroms.

Figure 3:
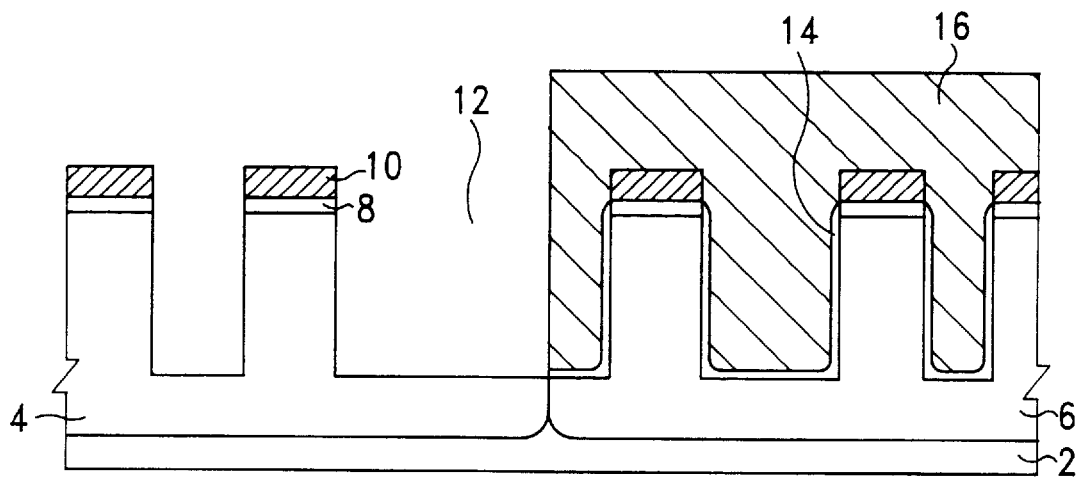
FIG. 3 is a cross section view of a semiconductor wafer illustrating the step of removing the SAC layer that is formed on the P-well in accordance with the present invention.

Turning to FIG. 3, a photoresist 16 is patterned on the on the N-well 6 to expose the P-well 4. Then, the SAC layer 14 that is formed on the P-well is removed by etching. Generally, the SAC layer 14 can be removed by using BHF solution. The photoresist 16 is then stripped away.

Figure 4:
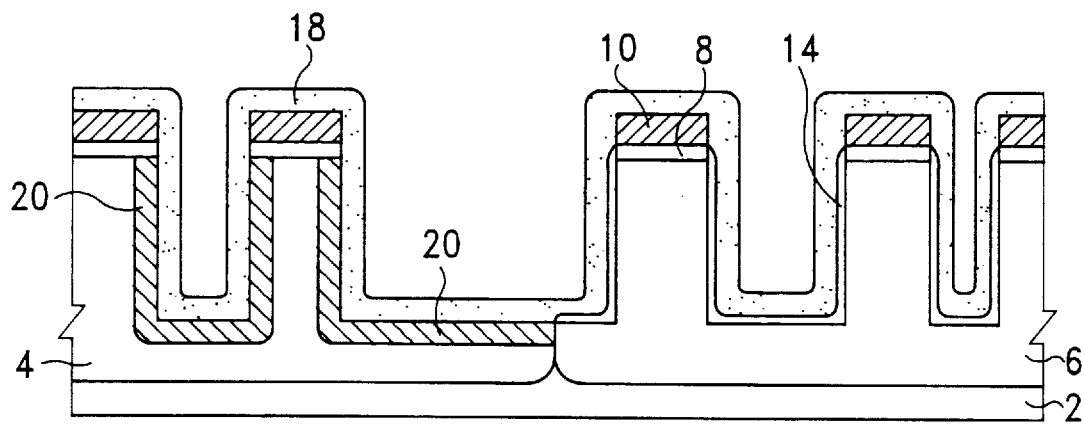
FIG. 4 is a cross section view of a semiconductor wafer illustrating the steps of forming a BSG layer over the substrate and performing a thermal process to form a channel stop layer in the P-well in accordance with the present invention.

Turning next to FIG. 4, a BSG layer 18 is formed along the surface of the trenches 12. In the P-well 4, the BSG layer 18 is formed on the substrate 2. According, in the N-well, the BSG layer 18 is formed on the SAC layer 14. Then, a thermal process is performed in an inert ambient for driving boron ions in the BSG layer 18 to diffuse from the BSG layer 18 into the substrate 2. Thus, a channel stop layer 20 is formed in the P-well 4 by the thermal process. Further, the SAC layer 14 on the N-well 6 can prevent the boron ions from diffusing into the N-well 6. The temperature of the thermal process is about 900°–1000° C.

Figure 5:
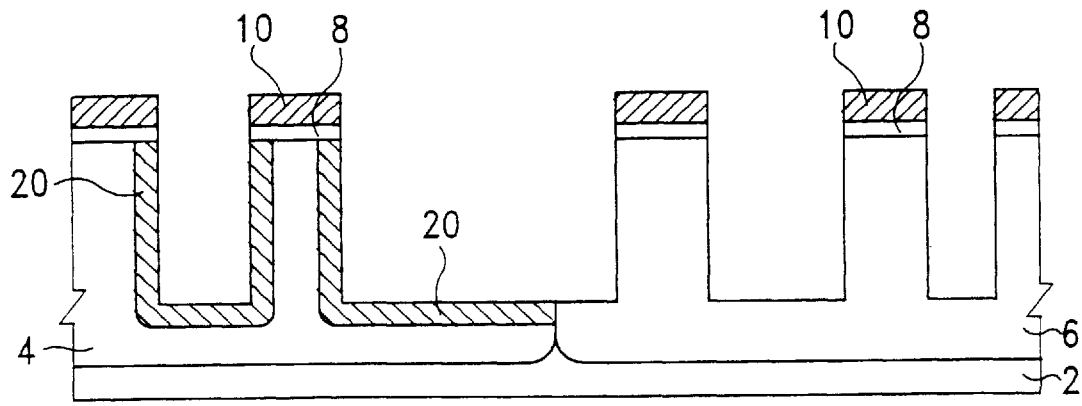
FIG. 5 is a cross section view of a semiconductor wafer illustrating the step of removing the BSG layer in accordance with the present invention.

Turning next to FIG. 5, the BSG layer 18 is removed by using HF as the etchant. Next, the SAC layer 14 is removed by using HF.

Figure 6:
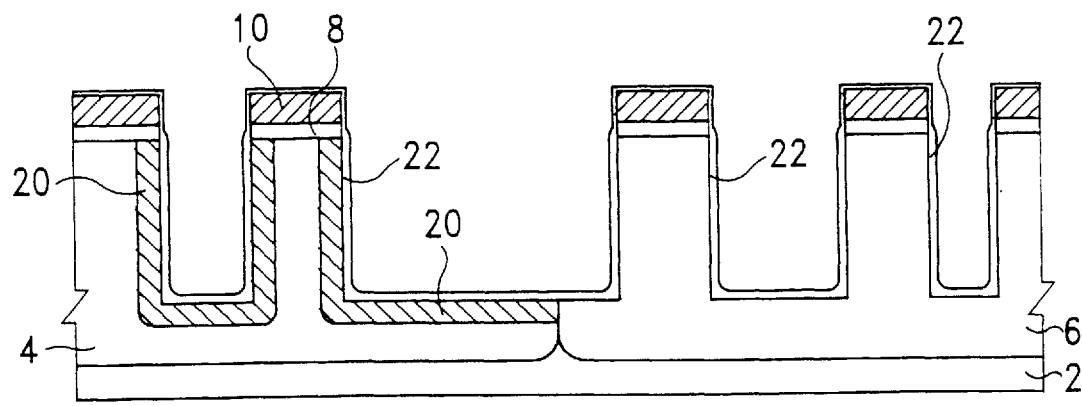
FIG. 6 is a cross section view of a semiconductor wafer illustrating the step of forming an oxide layer along the surface of the shallow trenches in accordance with the present invention.

As shown in FIG. 6, an oxide layer 22 is formed on the surfaces of the trenches 12 and on the silicon nitride layer 10. The oxide layer 22 is preferably formed by thermal oxidation. The thickness of the oxide layer 22 is in the range of about 150 to 200 angstroms. The oxide layer 22 is used to provide the selective deposition of LPD oxide. Typically, the oxide 22 that is formed on the silicon mitride layer 10 is less than the oxide layer 22 that is in the trench 12. The oxide layer 22 that is formed on the silicon nitride layer 10 is then dipped off by using wet strip.

Figure 7:
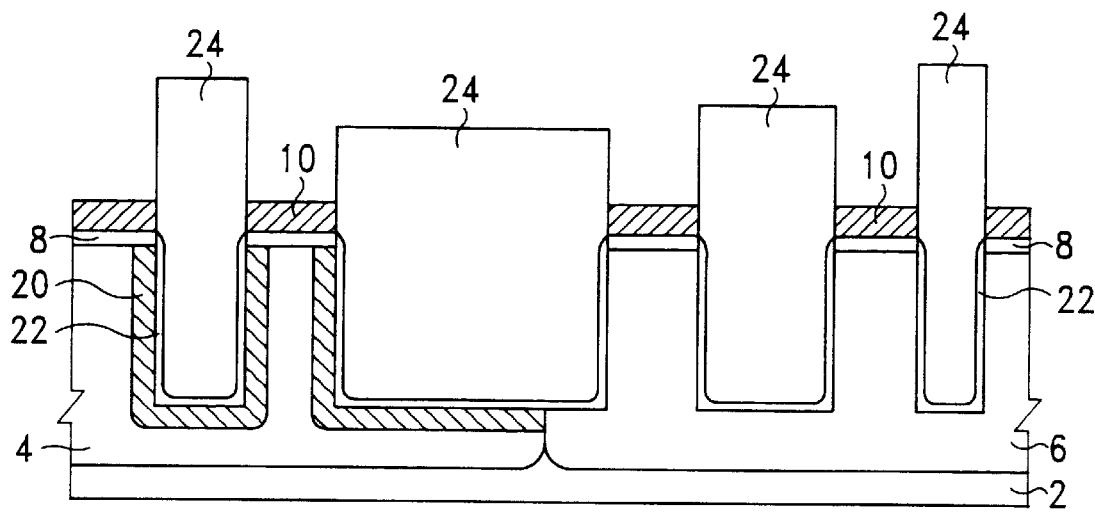
FIG. 7 is a cross section view of a semiconductor wafer illustrating the step of forming a selective LPD-oxide in the shallow trenches for isolation in accordance with the present invention.

Turning to FIG. 7, a LPD oxide layer 24 selectively is deposited and refilled into the shallow trenches 12. The LPD oxide can not be formed on the silicon nitride layer 10. The thickness of the LPD oxide layer 14 is about 2000 to 8000 angstroms. The advantage of the LPD oxide layer 24 is that it can be conformably formed on a substrate 2. Further, the LPD oxide 24 is selectively deposited against the silicon nitride layer 10. Therefore, the LPD oxide layer 24 will not be formed on the silicon nitride layer 10. Typically, the chemical solution used to form the LPD oxide films is called "treatment solution".

The formation of the treatment solution according to the present invention is described as follows. In the preferred embodiment, first, 21 g of silica-gel powder with purity of 99.99% is added to 450 ml of industrial grade (4 mol/l) hydrofluorosilicic acid aqueous solution at the temperature of 23° C. The mixed solution is then stirred for 17 hours at the temperature of 23° C. Next, the solution is filtered to remove the undissolved silica-gel. The hydrofluorosilicic acid solution saturated with silicon dioxide is obtained. The impurities of hydrofluorosilicic acid are listed as follows:

| impurity | assay |
| --- | --- |
| Fe | 0.01% |
| heavy metal (for example Pb) | 0.003% |
| Chloride | 0.005% |
| Sulfate(SO4) | 0.01% |

The next step is the preparation of boric acid. 1.885 g of pure boric acid is added into 300 ml water. Then, the solution is stirred uniformity at 23° C. Therefore, the boric acid with concentration of 0.1 mol/l is obtained.

64 ml of the treatment solution (4 mol/l) is diluted with deionized water to be a concentration of 3.56 mol/l solution. Then, 5.6 ml of boric acid (0.1 mol/l) is added to the solution. The solution is uniformly stirred before the substrate is immersed into the solution. Next, the substrate is immersed into the solution at a temperature about 40° C. Thus, the LPD oxide layer 24 is formed over the substrate.

Figure 8:
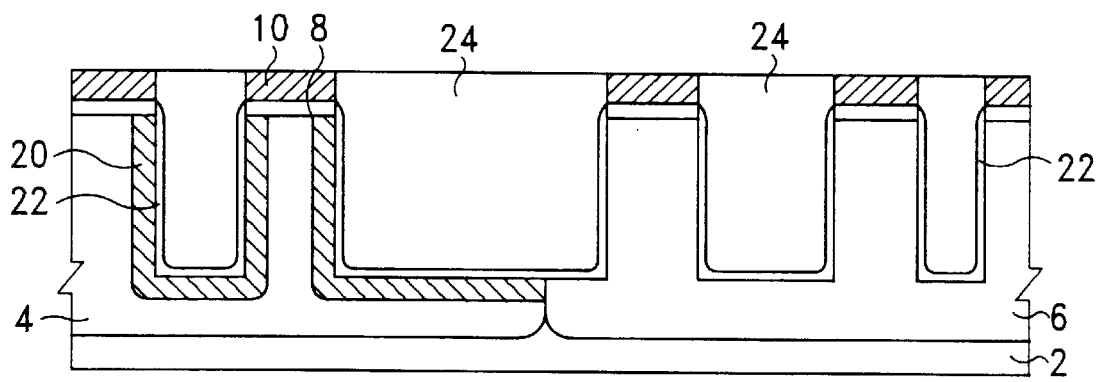
FIG. 8 is a cross section view of a semiconductor wafer illustrating the step of performing a CMP process for planarization in accordance with the present invention.

Referring next to FIG. 8, a CMP process is performed to remove a portion of the LPD oxide layer 24 to the surface of the silicon nitride layer 10 for planarization. Residual LPD oxide 24 is remained in the trenches 12. Thus, the shallow trench isolations 24a are formed.

Figure 9:
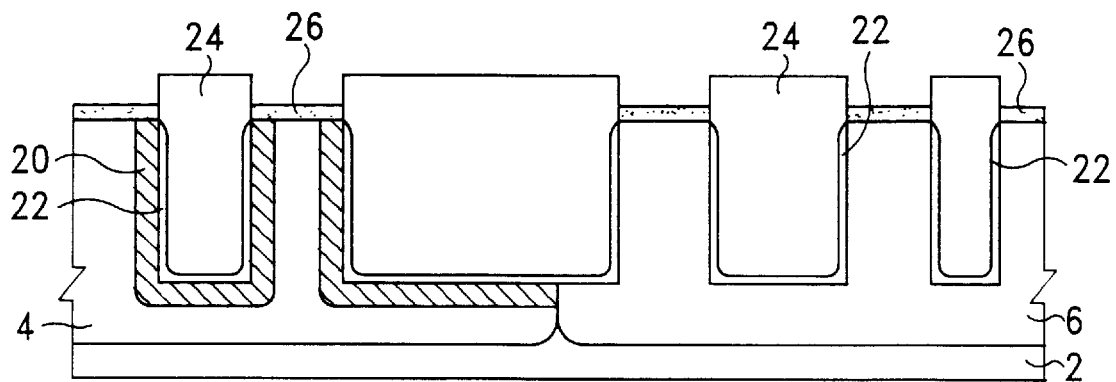
FIG. 9 is a cross section view of a semiconductor wafer illustrating the step of removing the silicon nitride layer and the pad oxide layer in accordance with the present invention.

Referring to FIG. 9, subsequently, the silicon nitride layer 10 and the silicon oxide layer 8 are removed, respectively.

Preferably, the silicon nitride layer 10 can be removed by hot phosphorus acid. The silicon oxide layer 8 is removed using HF solution. A further SAC layer 26 can be formed on the substrate 2 for subsequent processes. Then, the SAC layer 26 is removed.

Figure 10:
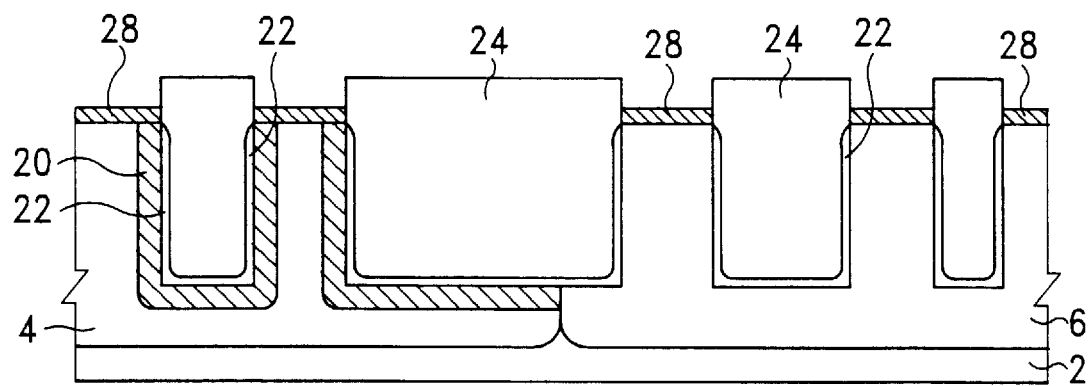
FIG. 10 is a cross section view of a semiconductor wafer illustrating the step of forming a gate oxide layer on the substrate in accordance with the present invention.

Referring to FIG. 10, a silicon oxide layer 28 is formed on the substrate 2 adjacent to the shallow trench isolations 24a. The silicon oxide 28 is used to act a gate oxide layer 28.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a shallow trench isolation on a silicon wafer, a P-well and an N-well being formed in said silicon wafer, said method comprising:

forming a pad layer on said silicon wafer;

forming a silicon nitride layer on said pad layer;

forming a plurality of trenches in said silicon wafer by etching said silicon nitride layer, said pad layer and said silicon wafer;

forming a first sacrificial (SAC) oxide layer on the surface of said trenches and on the surface of said pad oxide layer;

removing said first SAC oxide layer that is formed on said P-well;

forming a BSG layer along the surface of said trenches, said BSG layer being on said pad oxide layer, said silicon nitride layer and said first SAC oxide layer;

performing a thermal process for driving the boron ions that is in said BSG layer to diffuse into said P-well, therefore a channel stop layer being formed in said P-well;

removing said BSG layer;

removing said first SAC oxide layer;

forming an oxide layer along the surface of said trenches and on the surface of said pad oxide layer;

forming a liquid phase deposition (LPD) oxide layer in said trenches for isolation;

performing a CMP process to remove a portion of said LPD oxide layer to the surface of said silicon nitride layer for planarization;

removing said silicon nitride layer; and removing said pad oxide layer.

2. The method of claim 1, further comprises the following steps of forming said trenches:

patterning a photoresist on said silicon nitride layer to define a plurality of trench regions; and etching said silicon nitride layer, said pad layer and said silicon wafer by using said photoresist as a mask; and removing said photoresist.

3. The method of claim 1, further comprises the step of forming a gate oxide layer on said wafer adjacent to said trenches after removing said pad oxide layer.

4. The method of claim 3, further comprises the following steps before forming said gate oxide layer:

forming a second SAC layer on said wafer; and removing said second SAC layer.

5. The method of claim 1, wherein the temperature of said thermal process is about 900°–1000° C.

6. The method of claim 1, wherein the thickness of said LPD oxide layer is about 2000 to 8000 angstroms.

7. The method of claim 1, wherein said pad layer is composed of silicon oxide.

8. The method of claim 1, wherein said silicon nitride layer is formed by a method selected from the group consisting of Low Pressure Chemical Vapor Deposition (LPCVD), Plasma Enhance Chemical Vapor Deposition (PECVD) and High Density Plasma Chemical Vapor Deposition (HDPCVD).

9. The method of claim 8, wherein the reaction gases of forming said silicon nitride layer are $SiH_4$, $NH_3$, $N_2$ and $N_2O$.

10. The method of claim 8, wherein the reaction gases of forming said silicon nitride layer are $SiH_2Cl_2$, $NH_3$, $N_2$ and $N_2O$.

11. The method of claim 1, wherein said silicon nitride layer is removed by using hot phosphorous acid.

12. The method of claim 7, wherein said pad oxide layer is removed by using HF solution.

13. The method of claim 3, wherein said first SAC oxide layer is removed by using HF solution.

14. The method of claim 4, wherein said second SAC oxide layer is removed by using HF solution.

* * * * *